United States Patent
Ahlers et al.

(10) Patent No.: US 10,879,384 B2
(45) Date of Patent: Dec. 29, 2020

(54) ALTERNATOR ASSEMBLY HAVING A GATED DIODE ARRANGED IN A LOAD PATH BETWEEN AN INPUT TERMINAL AND AN OUTPUT TERMINAL

(71) Applicant: Infineon Technologies AG, Neubiberg (DE)

(72) Inventors: Dirk Ahlers, Munich (DE); Markus Zundel, Egmating (DE); Dietrich Bonart, Bad Abbach (DE); Ludger Borucki, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/201,081

(22) Filed: Nov. 27, 2018

(65) Prior Publication Data

US 2019/0109226 A1   Apr. 11, 2019

Related U.S. Application Data

(63) Continuation of application No. 15/132,709, filed on Apr. 19, 2016, now Pat. No. 10,276,706, which is a
(Continued)

(51) Int. Cl.
| | | |
|---|---|---|
| *H01L 29/78* | (2006.01) |
| *H01L 29/36* | (2006.01) |
| *H01L 29/739* | (2006.01) |
| *H01L 29/08* | (2006.01) |
| *H01L 29/06* | (2006.01) |
| *H01L 29/10* | (2006.01) |
| *H01L 23/051* | (2006.01) |
| *H02J 7/24* | (2006.01) |
| *H02J 7/14* | (2006.01) |

(Continued)

(52) U.S. Cl.
CPC ........ *H01L 29/7802* (2013.01); *H01L 23/051* (2013.01); *H01L 29/0634* (2013.01); *H01L 29/086* (2013.01); *H01L 29/0834* (2013.01); *H01L 29/0878* (2013.01); *H01L 29/1095* (2013.01); *H01L 29/36* (2013.01); *H01L 29/7391* (2013.01); *H02J 7/24* (2013.01); *H01L 23/24* (2013.01); *H01L 29/861* (2013.01); *H01L 2924/0002* (2013.01); *H02J 7/14* (2013.01)

(58) Field of Classification Search
None
See application file for complete search history.

(56) References Cited

U.S. PATENT DOCUMENTS

| | | | |
|---|---|---|---|
| 4,705,759 A | 11/1987 | Lidow et al. | |
| 5,323,095 A * | 6/1994 | Kumar | B60L 7/04 318/152 |

(Continued)

FOREIGN PATENT DOCUMENTS

| | | |
|---|---|---|
| CN | 1691204 A | 11/2005 |
| CN | 101114773 A | 1/2008 |

(Continued)

*Primary Examiner* — Robert K Carpenter
(74) *Attorney, Agent, or Firm* — Murphy, Bilak & Homiller, PLLC (57) ABSTRACT

An alternator assembly includes an input terminal configured to input an alternating voltage, an output terminal configured to output a rectified voltage, and a gated diode arranged in a load path between the input terminal and the output terminal.

20 Claims, 10 Drawing Sheets

Related U.S. Application Data continuation of application No. 13/484,340, filed on May 31, 2012, now Pat. No. 9,324,625.

(51) Int. Cl.
*H01L 29/861* (2006.01)
*H01L 23/24* (2006.01)

(56) References Cited

U.S. PATENT DOCUMENTS

| | | |
|---|---|---|
| 5,818,084 A | 10/1998 | Williams et al. |
| 5,838,042 A | 11/1998 | Zambrano |
| 6,031,254 A | 2/2000 | Quoirin |
| 6,060,776 A | 5/2000 | Spitz et al. |
| 6,448,160 B1 | 9/2002 | Chang et al. |
| 6,667,545 B1 | 12/2003 | Spitz |
| 6,747,312 B2 | 6/2004 | Boden, Jr. |
| 6,873,511 B2 | 3/2005 | Spitz |
| 7,060,574 B2 | 6/2006 | Kim et al. |
| 7,332,788 B2 | 2/2008 | Ahlers et al. |
| 8,735,262 B2 | 5/2014 | Gruber et al. |
| 9,660,550 B2 | 5/2017 | Spitz et al. |
| 2005/0146928 A1 | 7/2005 | Luk et al. |
| 2005/0215042 A1 | 9/2005 | Hille et al. |
| 2007/0105454 A1 | 5/2007 | Spitz et al. |
| 2009/0153105 A1* | 6/2009 | Czajkowski ............ H02P 9/302 322/28 |

FOREIGN PATENT DOCUMENTS

| | | |
|---|---|---|
| CN | 201681943 U | 12/2010 |
| CN | 203415584 U | 1/2014 |
| DE | 102007005636 | 11/2008 |
| DE | 102009038731 A1 | 7/2010 |
| EP | 0110331 A2 | 6/1984 |
| EP | 0821411 A1 | 1/1998 |
| JP | 04368423 A | 12/1992 |
| JP | 2006286508 A | 10/2006 |
| TW | 200301415 A | 7/2003 |
| TW | 201001865 A | 1/2010 |
| TW | 201007971 A | 2/2010 |
| TW | I339451 B | 3/2011 |
| TW | M423791 U | 3/2012 |
| WO | 9423457 | 10/1994 |

* cited by examiner

ALTERNATOR ASSEMBLY HAVING A GATED DIODE ARRANGED IN A LOAD PATH BETWEEN AN INPUT TERMINAL AND AN OUTPUT TERMINAL

BACKGROUND

Vehicle generators powered by the engine of an automobile are used to load car batteries. A rectifier assembly of a battery charging circuit rectifies the alternating voltage output by the vehicle generator and provides a rectified battery charge voltage to the car battery. The rectifier assembly is typically based on pn diodes providing a low forward bias voltage to minimize power losses as well as a well-defined reverse breakdown characteristics to reliably protect electronic circuits in the vehicle in the case of a load dump. It is desirable to provide battery charging and generator assemblies with improved performance.

SUMMARY

According to an embodiment a battery charging assembly includes a gated diode arranged in a load path between an input terminal for inputting alternating voltage and an output terminal for supplying a rectified battery charge voltage derived from the input alternating voltage.

According to a further embodiment, a gated diode includes a base which is configured to be press-fit into an opening of a diode carrier plate. The gated diode may be press-fitted from both sides of the diode carrier plate. The base includes a pedestal portion with a first flat surface. A head wire includes a wire portion and a head portion with a second flat surface. A semiconductor die includes a gated diode structure. A first solder layer engages and electrically connects the semiconductor die with the first flat surface of the base. A second solder layer engages and electrically connects the semiconductor die with the second flat surface of the head wire.

According to yet a further embodiment, a gated diode includes source zones and a drain zone which are both of a first conductivity type. The source zones directly adjoin a first surface of a semiconductor die and the drain zone directly adjoins an opposite second surface of the semiconductor die. The drain zone includes a drift zone formed in an epitaxial layer of the semiconductor die. Base zones of a second conductivity type, which is the opposite of the first conductivity type, are provided between the drain zones and the source zones. The drift zone further includes adjustment zones directly adjoining a base zone and arranged between the respective base zone and the second surface, respectively. A net dopant concentration in the adjustment zone is at least twice a net dopant concentration in the second sub-zone.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s)

adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
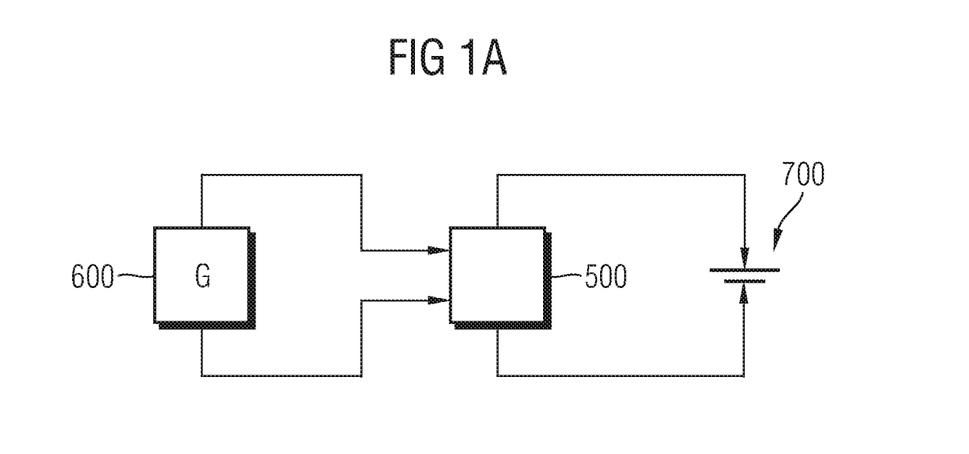
FIG. 1A is a schematic block diagram showing a vehicle generator with a battery charging assembly according to an embodiment.

FIG. 1A shows a battery charging assembly 500 with input terminals for receiving alternating voltage from a vehicle generator (alternator) 600. Subject to the number of stator windings of the vehicle generator 600, the battery charging assembly 500 may include one, two, three or more input terminals. The battery charging assembly 500 rectifies the alternating voltage received from the vehicle generator and supplies a rectified battery charge voltage to a car battery 700.

Figure 1B:
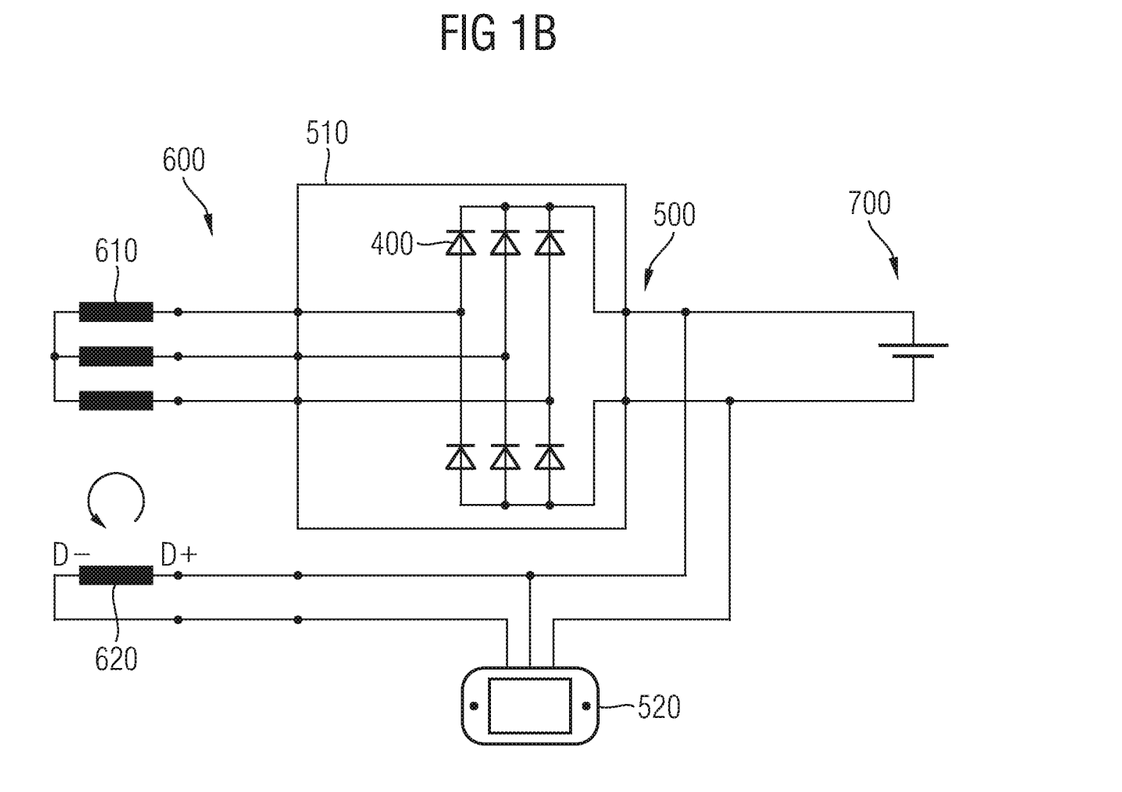
FIG. 1B is a simplified circuit diagram of a battery charging assembly according to an embodiment.

As illustrated in FIG. 1B, the vehicle generator 600 may include three stator windings 610 for generating three phases of alternating voltage, each phase displaced by one-third of a period of the alternating voltage with respect to the other phases. The current in the stator windings 610 is induced by the magnetic field of a turning rotor winding 620.

The battery charging assembly 500 includes a rectifier assembly 510. For each input terminal connecting the rectifier assembly 510 with one of the stator windings 610, the rectifier assembly 510 provides a pair of gated diodes 400 (gate-controlled diodes, channel diodes) such that the output current is supplied during both the positive and the negative half-periods of the phases. Cathode terminals of a first set of the gated-diodes 400 for supplying the rectified battery charge voltage during the positive half-periods are connected with each other and the anode terminal of the car battery 700. Anode terminals of a second set of the gated-diodes 400 for supplying the rectified battery charge voltage during the negative half-periods are connected with each other and the cathode terminal of the car battery 700.

A controller circuit 520 controls a voltage across the rotor winding 620 subject to the output voltage of the rectifier assembly 510 to obtain a specified output voltage.

The gated diodes 400 provide a low forward bias voltage or on state resistance RDSon such that the rectifier assembly 510 dissipates less power than comparable rectifier assemblies based on pn diodes.

With regard to rectifier assemblies based on Schottky diodes, the forward bias voltage of Schottky diodes is defined by the metal materials providing the Schottky junction and cannot be varied easily by simply modifying process parameters. As a result any change of the specification of the forward bias voltage due to modified application requirements requires an elaborate change of the manufacturing process. Further the metal materials tend to degrade during lifetime under harsh environmental conditions. In contrast, the on-state resistance or forward bias voltage of the gated-diodes 400 is subject to device parameters, which can be modified by simply modifying a well controllable process parameter like dopant concentration or layer thickness, for example the thickness of the gate dielectric, which are stable even under harsh environmental conditions.

Figure 1C:
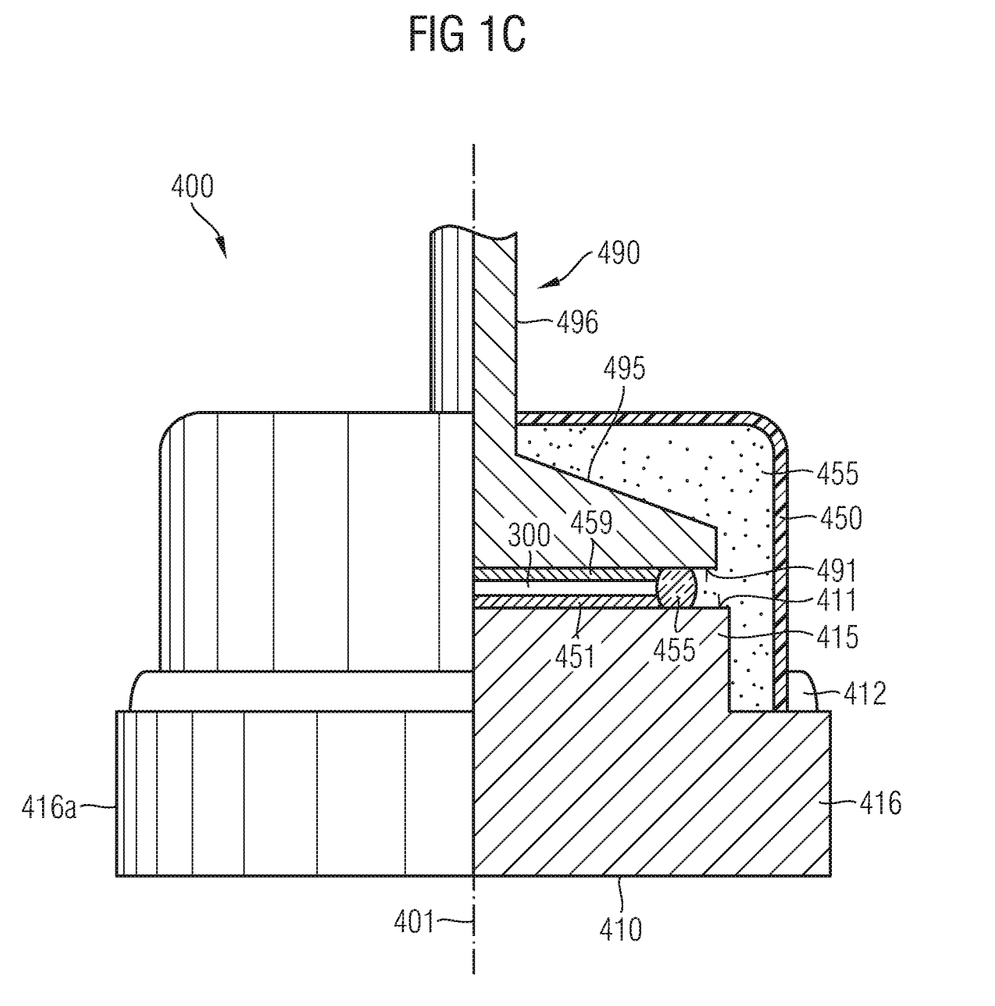
FIG. 1C is a schematic partial cutaway of a gated diode with a press-fit housing according to a further embodiment.

FIG. 1C is a partial cutaway of a gated diode 400. A pedestal portion 415 has a smaller cross-sectional area than a socket portion 416 of the base 410. According to an embodiment, the gated diode 400 is rotational-symmetric with respect to a longitudinal axis 401 and the pedestal portion 415 has a smaller diameter than the socket portion 416. The socket portion 416 may have a serrated lateral surface 416a such that the socket portion 416 can be press-fitted into an opening of a diode carrier plate. The pedestal portion 415 has a first flat surface 411. An engagement portion 412, for example a ring having a diameter smaller than that of the socket portion 416 and greater than that of the pedestal portion 415 may extend from the socket portion 416 at the side of the pedestal portion 415.

A head wire 490 includes a head portion 495 with a second flat surface 491 which surface area is approximately as large as that of the first flat surface 411. A wire portion 496 of the head wire 490 has a smaller diameter than the head portion 495 and provides a terminal supporting attachment of a cable connection. The head wire 490 and the base 410 are arranged at a distance to each other with the first and second flat surfaces 411, 491 being parallel to each other and with the longitudinal axes of the base 410 and the head wire 490 coinciding. A gap of uniform width results between the base 410 and the head wire 490. In the gap, a first solder layer 451 engages and electrically connects a semiconductor die 300 with the base 410. A second solder layer 459 engages and electrically connects the semiconductor die 300 with the head wire 490. A passivation structure 455 may seal an inner portion of the gap with the semiconductor 300. Subject to the orientation of the semiconductor die 300 in the gated diode 400, the base 410 may provide the cathode or the anode terminal.

A sleeve 450 may be engaged on the inner diameter of the peripheral portion 412 and may enclose the pedestal portion 415, the head portion 495 and the gap between the head portion 495 and the pedestal portion 415. A fill material 455 may fill a space shrouded by the sleeve 450.

According to the embodiments, the semiconductor die 300 includes a gate controlled diode structure. Providing a gated diode with a press-fit housing allows for improved rectifier assemblies with diode carrier plates having openings for press-fit housings. Conventional diode carrier plates may be used without modifications allowing a one-to-one replacement of pn and Schottky diodes by gated diodes in existing rectifier assemblies, battery charging assemblies and vehicle generators.

Figure 2A:
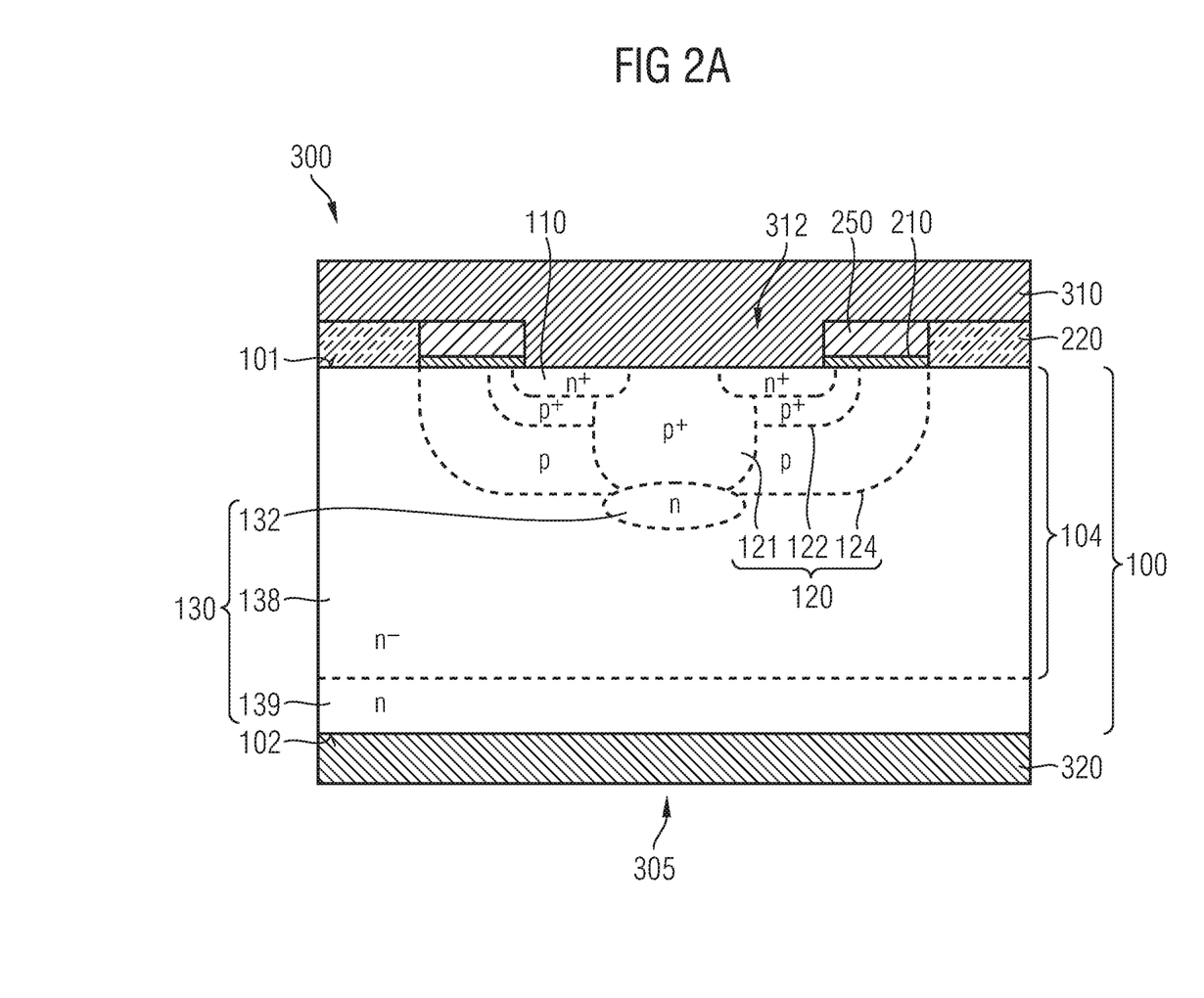
FIG. 2A is a schematic cross-sectional view of a portion of a semiconductor die of a gated diode in accordance with an embodiment providing an adjustment zone directly adjoining a base contact zone.

FIG. 2A shows a portion of a semiconductor die 300 including a gate controlled diode structure 305 which may be provided in the gated diode 400 of FIG. 1C and in the gated diodes 400 of the rectifier arrangement 510 of FIG. 1B.

The semiconductor die 300 includes a semiconductor body 100 which is formed from a semiconductor substrate. The semiconductor body 100 is provided from a semiconducting material, for example silicon Si, silicon carbide SiC, germanium Ge, silicon germanium SiGe, gallium nitride GaN or gallium arsenide GaAs. Outside the illustrated portion, the semiconductor body 100 may include further doped and undoped sections, epitaxial semiconductor layers and previously or later fabricated insulating and conducting structures.

The semiconductor body 100 has a first surface 101 and a second surface 102 which is opposite to the first surface 101. Along the first surface 101, source zones 110 are formed in the semiconductor body 100. A drain zone 130 directly adjoins the second surface 102. Both the drain zone 130 and the source zones 110 have a first conductivity type. The drain zone 130 includes a drift zone 138 formed in a lightly doped epitaxial layer 104 of the semiconductor body 100. Base zones 120 are formed between the source zones 110 and the drain zone 130. The base zones 120 have a second conductivity type, which is the opposite of the first conductivity type. In the illustrated example, the first conductivity type is the n-type and the second conductivity type is the p-type. According to other embodiments, the first conductivity type is the p-type and the second conductivity type is the n-type.

Each base zone 120 may comprise a well implant zone 124 or may include further doped zones which may partly overlap with the well implant zone 124. The well implant zone 124 may be formed by counter-doping the lightly doped epitaxial layer 104 by introducing, for example by an implant process, impurities of the second conductivity type into a predefined section of the epitaxial layer 104. According to an embodiment, each base zone 120 may include a channel adjustment zone 122 formed within the well implant zone 124 and having a net dopant concentration that is higher than the net dopant concentration in the well implant zone 124 outside the channel adjustment zone 122. According to an embodiment the net dopant concentration in the channel adjustment zone 122 is at least two times, for example at least ten times, the net dopant concentration outside the channel adjustment zone 122. The channel adjustment zone 122 overlaps with a gate electrode 250 and allows for shaping a conductive channel between the source zones 110 and the drain zone 130 subject to application requirements. Other embodiments may provide the base zones 120 without the channel adjustment zones 122.

Other embodiments may provide a base contact zone 121 formed completely within the well implant zone 124 or partly overlapping the well implant zone 124. The base contact zone 121 directly adjoins the first surface 101 and may be provided between neighboring source zones 110, by way of example. For example, one single source implant zone may be formed by locally counter-doping predefined sections of the well implant zone 124 and the base contact zone 121 may be formed by counter-doping a predefined section of the source implant zone. A net dopant concentration of the base contact zone 121 is higher than the net dopant concentration in the well implant zone 124 outside the base contact zone 121. According to an embodiment the net dopant concentration in the base contact zones 121 is at least two times, for example at least ten times the net dopant concentration outside the base contact zones 121. The base contact zones 121 provide a low-ohmic interface to the well implant zone 124 whereas the more lightly doped well implant zone 124 provides a high reverse breakdown voltage which is the minimum reverse voltage at which the gate controlled diode structure breaks through.

Gate dielectrics 210 separate the gate electrodes 250 from the base zones 120. According to an embodiment, the gate electrodes 250 may be provided in trenches extending from the first surface 101 into the semiconductor body 100. According to the illustrated embodiment, the gate electrodes 250 are provided outside the volume of the semiconductor body 100. The gate electrodes 250 may be provided from a material providing a suitable work function, for example highly doped polycrystalline silicon.

A potential applied to the gate electrode 250 of the gate controlled diode structure 305 controls the charge carrier distribution in a channel portion of the base zones 120 along the gate dielectric 210. In an on-state, charge carriers of the first conductivity type accumulate in the channel portion adjoining the gate dielectric 210 and form a conductive channel between the source zones 110 and the drain zone 130. In an off-state, the base zones 120 electrically separate the source zones 110 from the drain zone 130.

A first electrode layer 310, which in the illustrated embodiment provides an anode electrode of the gated diode structure 305, is electrically connected to the source zones 110 and the body zones 120 through contact portions 312 extending between the gate electrodes 250 and directly adjoining the semiconductor body 100. A dielectric structure 220 may separate the first electrode layer 310 from the drain layer 130. A second electrode layer 320, which in the illustrated embodiment provides a cathode electrode, may directly adjoin the second surface 102.

The dielectric structure 220 may include one or more sub-layers, for example an adhesive layer, a buffer layer and/or a diffusion barrier layer. According to an embodiment, the dielectric structure 220 includes a thermally grown silicon oxide layer which may be formed contemporaneously with the gate dielectric 210. The dielectric structure 220 may further include a diffusion barrier layer, for example a silicon nitride or silicon oxynitride layer. A thin silicon oxide layer can be provided from deposited oxide, for example using TEOS (tetraethylorthosilane) as a precursor material, or a silicate glass, for example undoped silicate glass, to form an adhesive or buffer layer. The dielectric structure 220 may further include a main layer provided from BSG (boron silicate glass), PSG (phosphorous silicate glass) or BPSG (boron phosphorous silicate glass). Other embodiments may provide less or more sub-layers.

At least one of the first and second electrode layers 310, 320 may consist of or include a sub-layer consisting of or containing, as main constituent(s) aluminum Al, copper Cu or alloys of aluminum or copper, for example AlSi, AlCu or AlSiCu. According to other embodiments, at least one of the first and second electrode layers 310, 320 consists of or includes a sub-layer containing, as main constituent(s), at least one of nickel Ni, titanium Ti, silver Ag, gold Au, platinum Pt and/or palladium Pd. For example, at least one of the first and second electrode layers 310, 320 may include two or more sub-layers, each sub-layer containing one or more of Ni, Tig, Ag, Au, Pt, Pd as main constituent(s) and/or alloys therefrom. The first and second electrode layers 310, 320 may include metal silicide structures formed selectively along interfaces to the semiconductor body 100 and/or the gate electrodes 250.

The drain zone 130 further includes adjustment zones 132 of the first conductivity type. Each adjustment zone 132 is assigned to one of the gate controlled diode structures 305. For each gate controlled diode structure 305, the adjustment zone 132 directly adjoins the base zone 120 and is arranged in a vertical direction orthogonal to the first surface 101 between the base zone 120 and the second surface 102. According to an embodiment, the adjustment zone 132 adjoins the base zone 120 where the net dopant concentration gradient in the vertical direction is the steepest. The net dopant concentration in the adjustment zone 132 is at least two times, for example at least ten times the net dopant concentration in the portions of the drift layer 138 adjoining the adjustment zone 132. The adjustment zone 132 may result from a surface implant performed during the epitaxial growth of the epitaxial layer 104 or as a deep implant after completion of the epitaxial layer 104.

Since the adjustment zone 132 is formed by an implant which position and dose can be precisely defined, the adjustment zone 132 provides a well-defined interface between the base zone 120 and the drain layer 130 in terms of the dopant concentration gradients even where the drift zone 138 is formed in the epitaxial layer 104, where the dopant concentration can fluctuate due to process imhomogeneities. Since the minimum reverse breakdown voltage is subject to the steepest dopant concentration gradient the breakdown condition appears first at the well-defined interface between the body contact zone 121 and the adjustment zone 132. The reverse breakdown voltage can be narrowly specified, since among a plurality of gated diodes resulting from the same manufacturing process, the distribution of the dopant concentration gradients and, as a consequence, the actual reverse breakdown voltages is narrow. Gated diodes based on the semiconductor die 300 can be specified with very narrow tolerances as regards the reverse breakdown voltage and reliably dissipate generator power in the case of a load dump. This characteristic is long time stable.

By comparison, since in Schottky diodes the reverse current is closely linked to the voltage drop at the Schottky junction, some designs provide shifting the position of the maximum electric field strength in the semiconductor body away from the Schottky junction in order to reduce the voltage drop at the Schottky junction. To this purpose some designs provide trenches such that the reverse breakdown takes place close to the trench bottom. However, edges and corners of the trenches may locally increase the electric field strength in a way which is difficult to be predicted and controlled in a manufacturing environment. As a result, the breakdown voltage of Schottky diodes varies comparatively strongly among devices of the same type and, in addition, may vary with time due to material degradation under harsh environmental conditions.

As a consequence, for example a rectifier arrangement as illustrated in FIG. 1B using a semiconductor die 300 with the gate controlled diode structure 305 illustrated in FIG. 2A can be narrowly specified as regards load dump conditions. Electronic circuits connected to the battery charging circuit or the car battery can operate more reliable at less effort at the side of the electronic circuits.

The adjustment zones 132 may adjoin central sections of the base zones 120, respectively. For example, the adjustment zones 132 may be formed in the projection of the base contact zones 121. Other embodiments may provide contact trenches extending between adjoining source zones 110 from the first surface into the semiconductor body 100, wherein the contact structures 312 extend into the contact trenches to electrically connect the first electrode layer 310 with the base zones 120. The contact trenches may be provided in addition to or instead of the base contact zones 121. The adjustment zones 132 may be formed in the projection of the contact trenches.

Figure 2B:
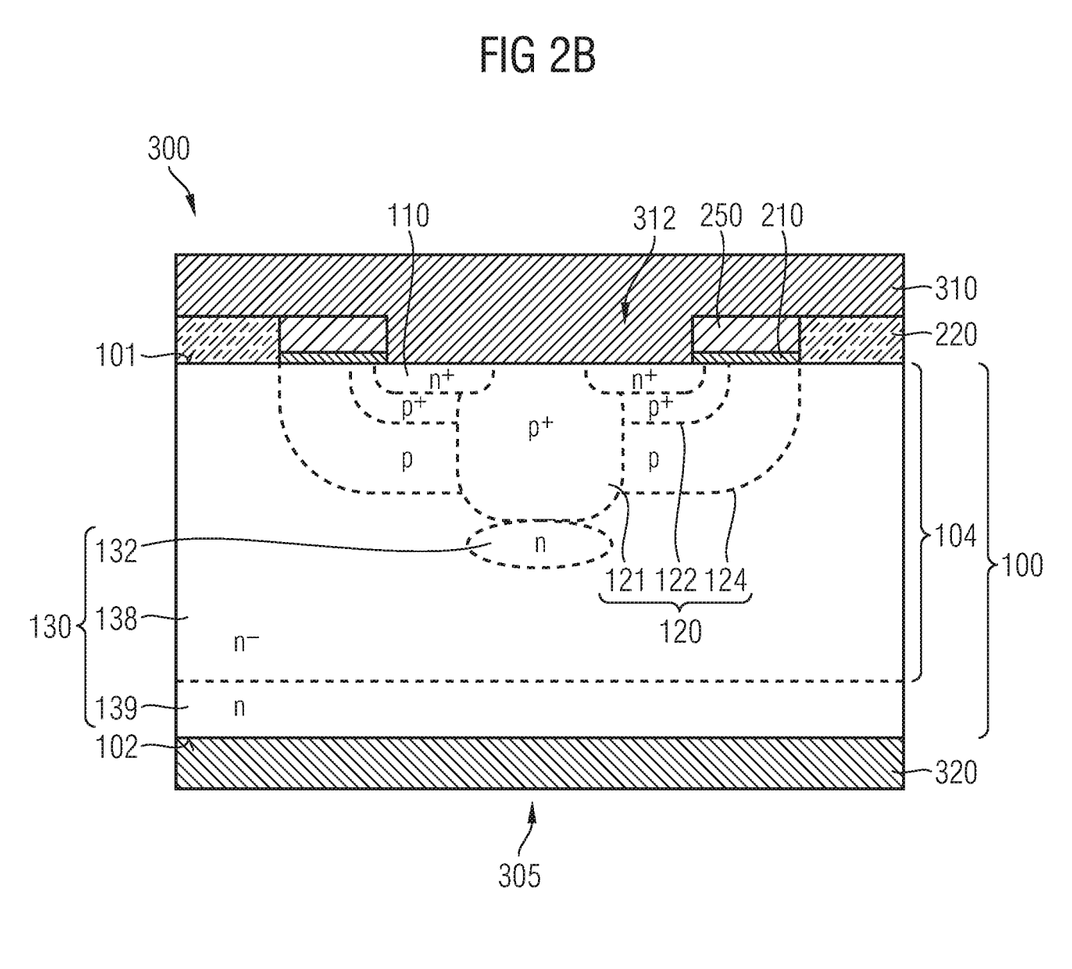
FIG. 2B is a schematic cross-sectional view of a portion of a semiconductor die of a gated diode in accordance with an embodiment providing a body contact zone extending beyond a well implant zone of the base zone.

According to an embodiment, in a central portion of the semiconductor die 300 the adjustment zones 132 adjoin center sections of the base zones 120, whereas in a peripheral portion oriented closer to an edge of the semiconductor die 300 the adjustment zones 132 may be displaced from the center sections such that the local reverse breakdown voltage is increased with decreasing distance to the edge of the semiconductor die 300. According to other embodiments, the distance between the adjustment zones 132 and the first surface 101 and/or the dopant concentration in the adjustment zones 132 may be subject to the distance to the edge of the semiconductor die 300 such that gate controlled diode structures 305 closer to the edge have a slightly higher reverse breakdown voltage than gate controlled diode structures 305 in the center portion.

Where in FIG. 2A the body contact zone 121 is completely formed within the well implant zone 124, the embodiment of FIG. 2B provides the body contact zone 121 extending deeper into the epitaxial layer 104 than the well implant zone 124 and the adjustment zone 132 being formed at a distance to the well implant zone 124 to better define the pn-junction with the steepest dopant concentration gradient.

Figure 2C:
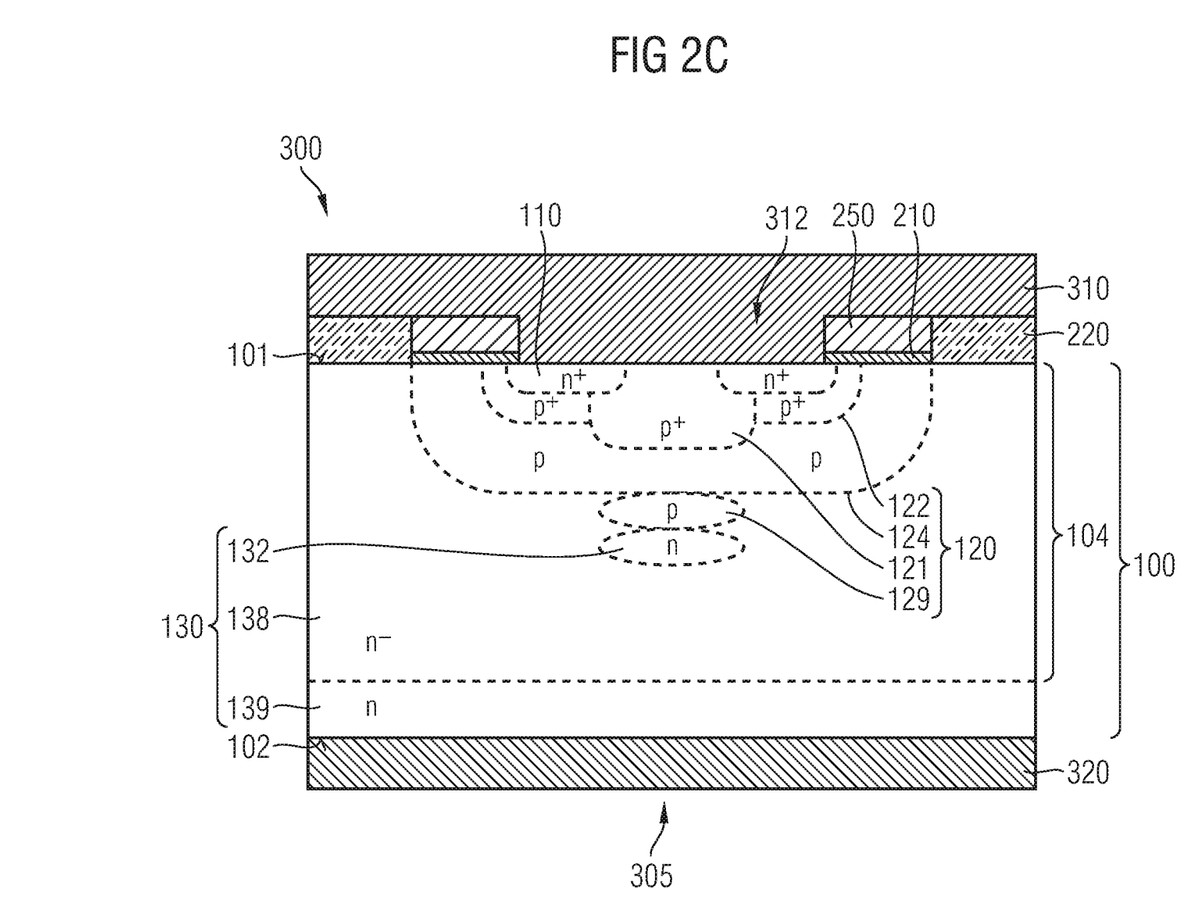
FIG. 2C is a schematic cross-sectional view of a portion of a semiconductor die of a gated diode in accordance with an embodiment providing a base extension zone.

FIG. 2C shows an embodiment providing a shallow base contact zone 121 that is formed completely within the well implant zone 124 and that does not reach the drift zone 138. A base extension zone 129 is formed between the well implant zone 124 and the adjustment zone 132. A net dopant concentration in the base extension zone 129 may be higher than in the well implant zone 124 but lower than in the base contact zone 121. The net dopant concentration in the base extension zone 129 does not depend on the net dopant concentration in the base contact zone 121. As a consequence, the minimum reverse breakdown voltage can be tuned independently from requirements for the base contact zone 121. The base extension zone 129 may be connected with the well implant zone 120 along a center section of the well implant zone 120. For example, the base extension zone 129 may be formed in the projection of the base contact zone 121. According to embodiments providing a contact trench extending from the first surface 101 into the semiconductor body 100, the base extension zone 129 may be provided in the projection of the contact trench.

According to another embodiment, in a central portion of the semiconductor die 300 the base extension zones 129 may adjoin center sections of the base zones 120, whereas in a peripheral portion oriented closer to an edge of the semiconductor die 300 the base extension zones 129 and the adjustment zones 132 may be displaced from the center sections such that the local reverse breakdown voltage is increased with decreasing distance to the edge of the semiconductor die 300. According to other embodiments, the distance between the base extension zones 129 and the first surface 101 and/or the dopant concentrations in the adjustment zones 132 and the base extension zones 129 may be subject to the distance to the edge of the semiconductor die 300 such that gate controlled diode structures 305 closer to the edge have a slightly higher reverse breakdown voltage than gate controlled diode structures 305 in the center portion.

Figure 2D:
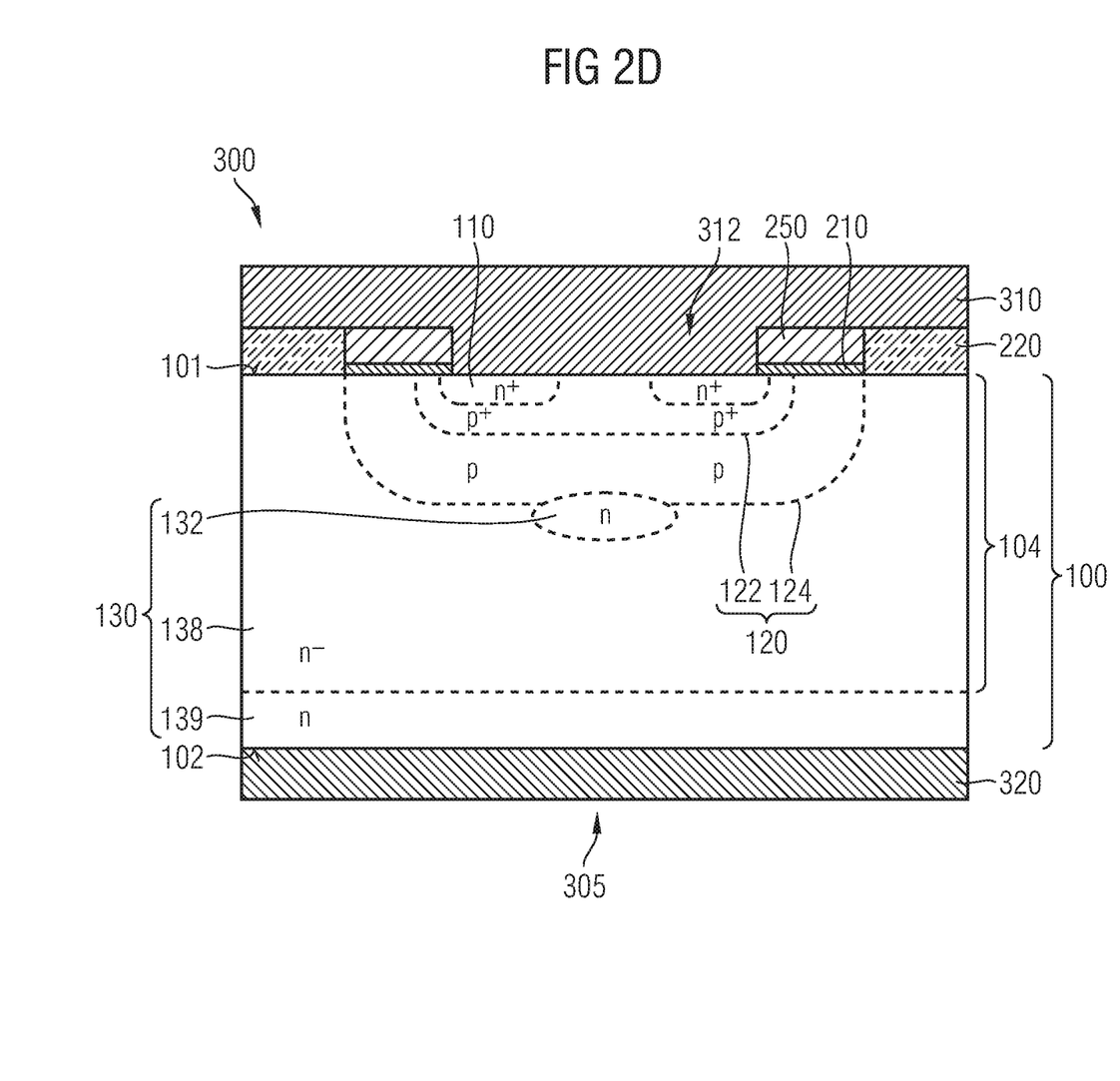
FIG. 2D is a schematic cross-sectional view of a portion of a semiconductor die of a gated diode in accordance with an embodiment without body contact zone.
Figure 3:
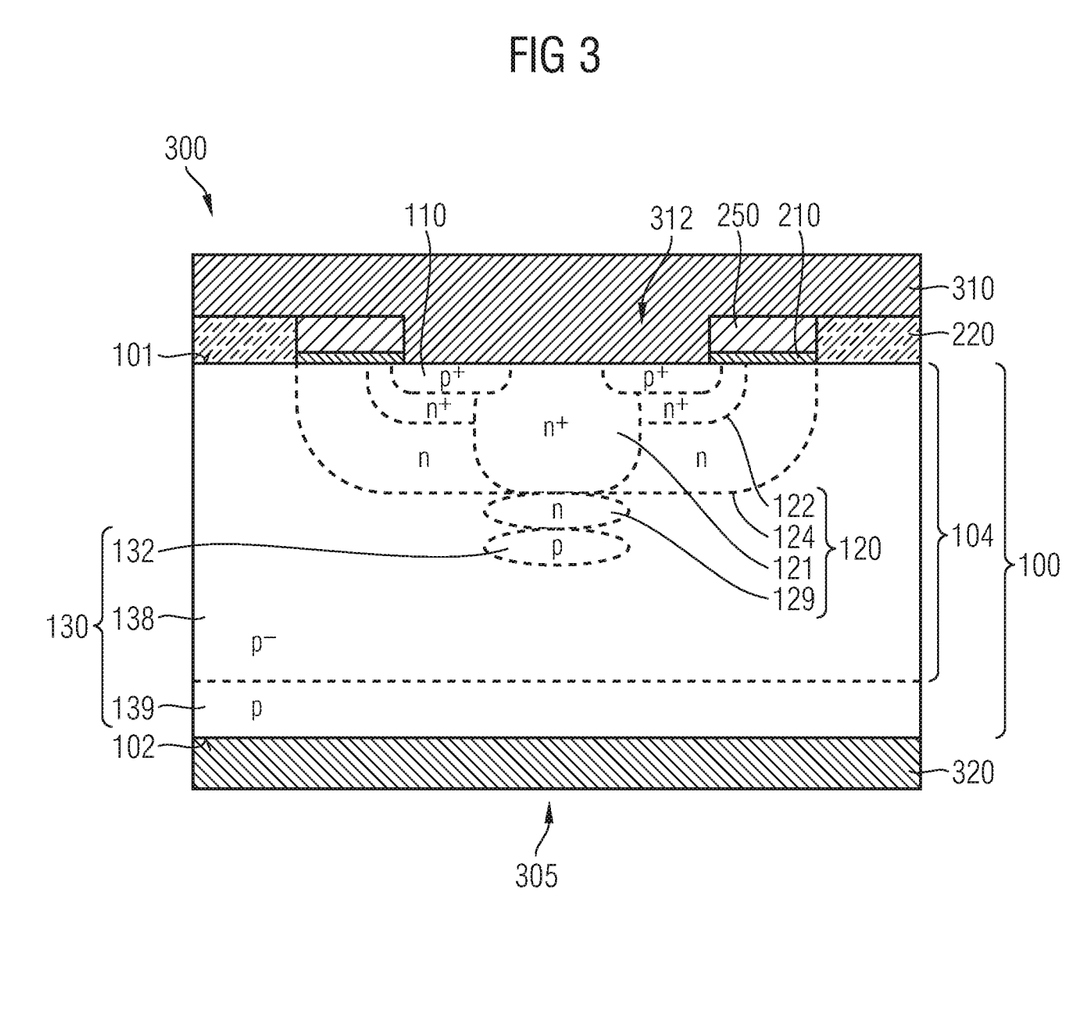
FIG. 3 is a schematic cross-sectional view of a portion of a semiconductor die of a gated diode in accordance with an embodiment providing a gated diode of a pnp type.

FIG. 2D refers to an embodiment where the source zones 110 are formed from spatially separated implants to provide a low-ohmic connection to the base zone 120 at lower total dopant concentrations. The reverse breakdown voltage is specified by the interface between the well implant zone 120 and the adjustment zone 132.

Where FIG. 2C refers to a gated npn diode, FIG. 3 refers to a corresponding gated pnp diode with an n-type base zone. Each of the doped zones and layers in FIG. 3 have the opposite conductivity type of the corresponding doped zones and layers in FIG. 2C.

Figure 4:
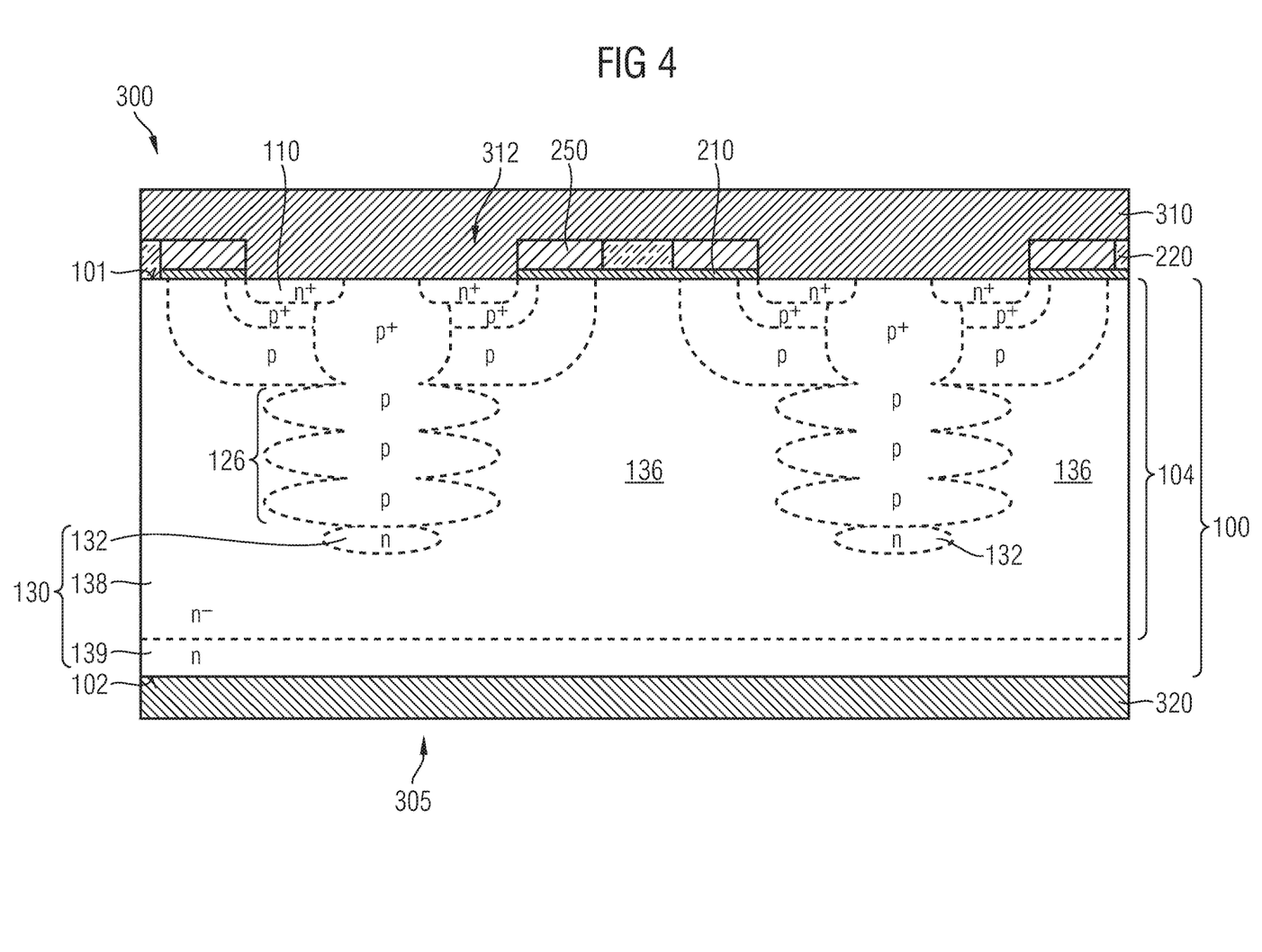
FIG. 4 is a schematic cross-sectional view of a portion of a semiconductor die in accordance with an embodiment providing a gated diode of a super junction type.

FIG. 4 refers to a gated diode 305 of the super junction type. The epitaxial layer 104 includes first columns 136 of the first conductivity type and second columns 126 of the second conductivity type. The first and second columns 136, 126 extend in a vertical direction perpendicular to the first surface 101 and are alternatingly arranged. The first columns 136 form portions of the drift zone 138 that directly adjoin the base zones 120. The drift zone 138 may further include a contiguous portion between the substrate layer 138 and the first and second columns 136, 126. Each second column 126 is connected with one of the base zones 120. The net dopant concentration in the first columns 136 may be the same of may be higher than in the contiguous portion.

A comparatively high net dopant concentration in the first columns 136 results in a low on-state resistance or forward bias voltage of the gate controlled diode structure 305. On the other hand, when a reverse voltage is applied, depletion zones extend between the first and second columns 136, 126 in a lateral direction such that a high reverse breakdown voltage can be achieved despite the high dopant concentration in the first columns 136.

Adjustment zones 132 are provided in a vertical projection between the second columns 126 and the second surface 102, the adjustment zones 132 directly adjoining a bottom of the second columns 126 and resulting from an implant process. The adjustment zones 132 precisely define the reverse breakdown voltage. In addition, base extension zones may be provided between the second columns 126 and the adjustment zones 132.

Figure 5:
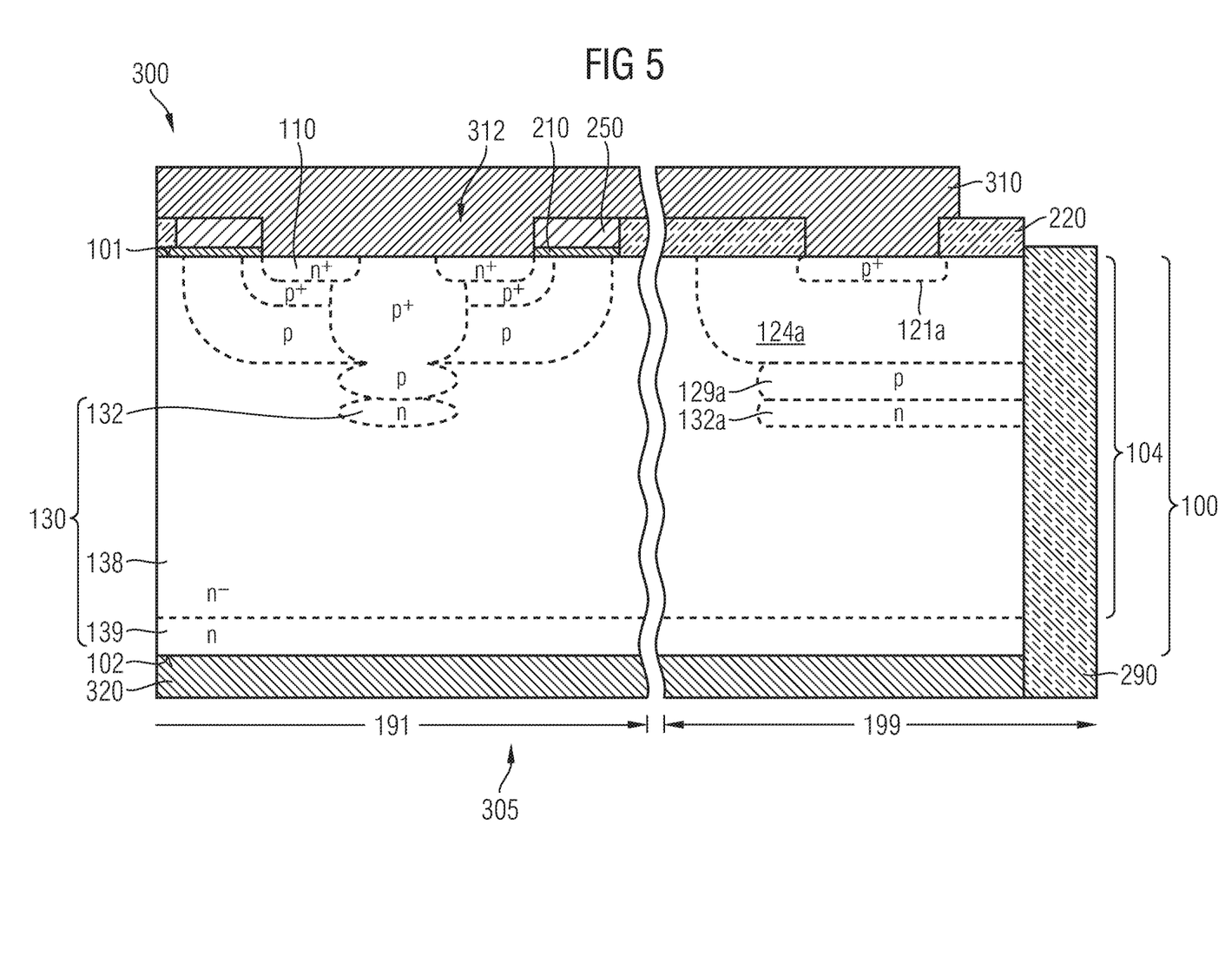
FIG. 5 is a schematic cross-sectional view of portions of a semiconductor die in accordance with an embodiment providing an edge termination construction.

FIG. 5 refers to an embodiment using implant processes for the formation of the adjustment zones 132 and the base extension zones 129 in a central portion 191 of the semiconductor die 300 for the formation of an edge termination construction in an edge portion 199 of the semiconductor die 300. The edge portion 199 includes first edge zones 129a corresponding to the base extension zones 129 and second edge zones 132a corresponding to the adjustment zones 132. The first edge zones 129a may be connected with the first electrode layer 310 through further doped zones 121a, 124a of the same conductivity, which directly adjoin the first surface 101. A dielectric edge structure 290 may be formed along a vertical edge of the semiconductor die 300 between the first and second surfaces 101, 102.

The first and second edge zones 129a, 132a correspond to the base extension zones 129 and adjustment zones 132 with respect to the distance to the first surface 101 and with respect to the dopant concentrations. The first and second edge zones 129a, 132a have a layered structure with approximately flat and uniform interface in terms of dopant concentration gradients between the first and second edge zones 129a, 132a. The interface ends at right angles at the dielectric edge structure 290. Due to the uniform interface, the local breakdown voltage in the edge portion 199 is slightly higher than in the central portion 191 providing bubble-shaped adjustment zones 132 and base extension zones 129 with non-uniform interfaces between the adjustment zones 132 and the base extension zones 129. Breakthrough conditions in the edge portion 199 which could spread the frequency distribution of the breakdown voltage of gated diodes of the same type can be avoided.

Figure 6:
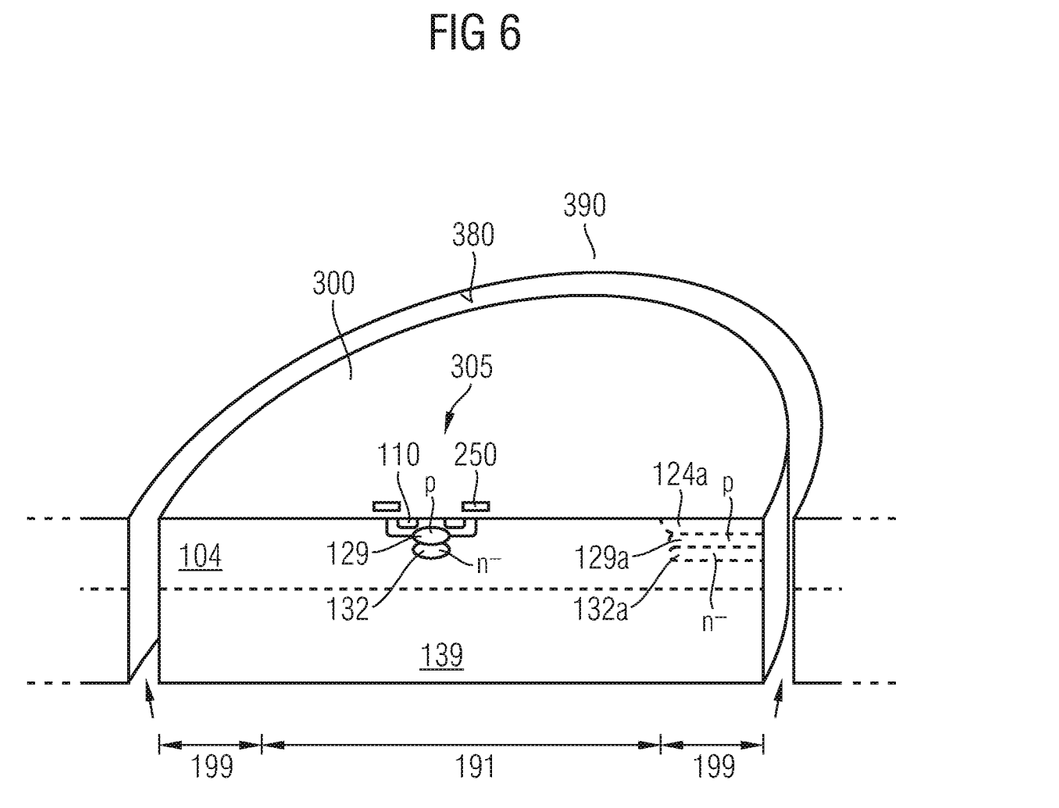
FIG. 6 is a schematic perspective view of a semiconductor die in accordance with a further embodiment.

FIG. 6 shows a circular-shaped semiconductor die 300 formed from a semiconductor substrate 390, wherein a ring-shaped edge portion 199 surrounds a central portion 191 of the semiconductor die 300. The circular-shaped semiconductor die 300 fits well in a rotational symmetric press-fit housing e.g. as illustrated in FIG. 1C.

In the central portion 191 gate controlled diode structures 305 include bubble-shaped adjustment zones 132 and base extension zones 129 with non-uniform interfaces between the adjustment zones 132 and the base extension zones 129. The edge portion 199 includes first and second edge zones 129a, 132a having a layered structure with a flat and, in terms of dopant concentration gradients, uniform interface between the first and second edge zones 129a, 132a. The interface ends at right angles at a DTI (deep trench insulator) 380, which may be a trench passivated by an oxide layer lining the trench. The DTIs 380 may be filled completely or only to a little account with an oxide such that the semiconductor die 300 may be separated from the surrounding semiconductor substrate 390 by a mechanical step including sawing and expanding a dicing tape provided for sawing.

A further embodiment refers to a generator assembly that includes a generator adapted to be powered by an automobile engine and to load a car battery when mounted in a vehicle and powered by the automobile engine of the vehicle. A rectifier assembly includes a gate controlled diode arranged in a load path between an input terminal for inputting alternating current and an output terminal for outputting a rectified battery charge voltage. The input terminal is electrically coupled to a stator winding of the generator.

According to an embodiment the rectifier assembly includes a diode carrier plate with an opening, wherein a gated diode is press-fitted into the opening. The gated diode may include a base adapted to be press-fitted into the opening and a pedestal portion with a first flat surface. The gated diode may further include a head wire that includes a head portion with a second flat surface and a wire portion. A first surface of the semiconductor die is soldered to the flat surface of the pedestal portion of the base and a second surface of the semiconductor die is soldered to the flat surface of the head portion of the head wire. The gated diode may be one as described above.

A further embodiment includes a semiconductor substrate, e.g. a semiconductor wafer, including a plurality of identical semiconductor dies for gated diodes. Each semiconductor die includes source zones and a drain zone of a first conductivity type, the source zones directly adjoining a first surface and the drain zone directly adjoining an opposite second surface of the respective semiconductor die, the drain zone comprising a drift zone formed in an epitaxial layer of the semiconductor die. Base zones of a second conductivity type opposite to the first conductivity type, are provided between the drain zone and the source zones. The drain zone comprises adjustment zones, wherein each adjustment zone directly adjoins one of the base zones and is arranged between the respective base zone and the second surface. The adjustment zones have a net dopant concentration at least twice a net dopant concentration in portions of the drift zone adjoining the adjustment zones. Further embodiments of the semiconductor substrate correspond to the embodiments of gated diodes as described by reference to the Figures.

What is claimed is:

1. An alternator assembly, comprising:
an input terminal configured to input an alternating voltage;
an output terminal configured to output a rectified voltage; and
a gated diode arranged in a load path between the input terminal and the output terminal,
wherein the gated diode is a channel diode comprising a gate electrode separated by a gate dielectric, the gate electrode being configured to provide channel control.

2. The alternator assembly of claim 1, wherein the gated diode comprises a semiconductor die comprising a source zone and a drain zone of a first conductivity type and a base zone of a second conductivity type, which is the opposite of the first conductivity type, the base zone formed between and separating the source zone and the drain zone.

3. The alternator assembly of claim 2, wherein the gate electrode is electrically connected to the source zone and the body zone.

4. The alternator assembly of claim 2, wherein the source zone directly adjoins a first surface of the semiconductor die, and wherein the drain zone directly adjoins an opposite second surface of the semiconductor die and comprises a drift zone.

5. The alternator assembly of claim 4, wherein the drain zone comprises an adjustment zone between the base zone and the second surface, and wherein in a vertical projection of the base zone with respect to the first surface, a net dopant concentration in the adjustment zone is at least twice a net dopant concentration in portions of the drift zone adjoining the adjustment zone.

6. The alternator assembly of claim 5, wherein the adjustment zone adjoins the base zone in a section where a gradient of the net dopant concentration in the base zone in a vertical direction orthogonal to the first surface is steepest.

7. The alternator assembly of claim 4, wherein the drain zone comprises a substrate layer having a net dopant concentration at least ten times the net dopant concentration in the drift zone.

8. The alternator assembly of claim 7, wherein the drift zone separates the substrate layer from the adjustment zone.

9. The alternator assembly of claim 4, wherein the drift zone is formed in an epitaxial layer of the semiconductor die.

10. The alternator assembly of claim 2, further comprising:
   a first column of the first conductivity type extending in a vertical direction between the base zone and the drift layer; and
   a second column of the second conductivity type extending in the vertical direction and connected with the base zone,
   wherein the adjustment zone is formed in the vertical direction of the second column and directly adjoins the second column.

11. The alternator assembly of claim 1, wherein the gated diode comprises:
   a base configured to be press-fit into an opening of a diode carrier plate and comprising a pedestal portion with a first flat surface; and
   a head wire comprising a head portion with a second flat surface and a wire portion, the base and head wire forming parts of a press-fit housing.

12. The alternator assembly of claim 11, wherein the semiconductor die is soldered to the first flat surface of the pedestal portion of the base and to the second flat surface of the head portion of the head wire.

13. The alternator assembly of claim 11, wherein the base comprises a socket portion with a serrated lateral surface.

14. The alternator assembly of claim 1, wherein the gated diode comprises:
   a base configured to be press-fit into an opening of a diode carrier plate and comprising a pedestal portion with a first flat surface;
   a head wire comprising a head portion with a second flat surface and a wire portion, the base and the head wire forming parts of the press-fit housing;
   a semiconductor die;
   a first solder layer engaging and electrically connecting the semiconductor die with the first flat surface of the base; and
   a second solder layer engaging and electrically connecting the semiconductor die with the second flat surface of the head wire.

15. The alternator assembly of claim 14, wherein the semiconductor die comprises a source zone and a drain zone of a first conductivity type and a base zone of a second conductivity type, which is the opposite of the first conductivity type, the base zone formed between and separating the source zone and the drain zone.

16. The alternator assembly of claim 15, wherein the gate electrode is electrically connected to the source zone and the body zone.

17. The alternator assembly of claim 15, wherein the source zone directly adjoins a first surface of the semiconductor die, and wherein the drain zone directly adjoins an opposite second surface of the semiconductor die and comprises a drift zone.

18. The alternator assembly of claim 17, wherein the drain zone comprises an adjustment zone between the base zone and the second surface, and wherein in a vertical projection of the base zone with respect to the first surface, a net dopant concentration in the adjustment zone is at least twice a net dopant concentration in portions of the drift zone adjoining the adjustment zone.

19. The alternator assembly of claim 15, further comprising:
   a first column of the first conductivity type extending in a vertical direction between the base zone and the drift layer; and
   a second column of the second conductivity type extending in the vertical direction and connected with the base zone,
   wherein the adjustment zone is formed in the vertical direction of the second column and directly adjoins the second column.

20. The alternator assembly of claim 14, wherein the base comprises a socket portion with a serrated lateral surface.

* * * * *